(12) United States Patent
Kumhyr et al.

(10) Patent No.: US 8,242,793 B2
(45) Date of Patent: Aug. 14, 2012

(54) ELECTROMAGNETIC PROFILING TO VALIDATE ELECTRONIC DEVICE AUTHENTICITY

(75) Inventors: David B. Kumhyr, Austin, TX (US); Glenn D. Johnson, Pflugerville, TX (US); William C. Bulko, Austin, TX (US); Jacobo A. Vargas, Austin, TX (US); Yvonne M. Young, Elgin, TX (US)

(73) Assignee: International Business Machines Corporation, Armonk, NY (US)

( * ) Notice: Subject to any disclaimer, the term of this patent is extended or adjusted under 35 U.S.C. 154(b) by 582 days.

(21) Appl. No.: 12/405,453

(22) Filed: Mar. 17, 2009

(65) Prior Publication Data

US 2010/0237854 A1    Sep. 23, 2010

(51) Int. Cl.
    *G01R 31/3187*    (2006.01)
(52) U.S. Cl. .................................. 324/750.3
(58) Field of Classification Search .......... None
    See application file for complete search history.

(56) References Cited

U.S. PATENT DOCUMENTS

| | | | |
|---|---|---|---|
| 4,829,238 A | 5/1989 | Goulette et al. | |
| 5,218,294 A | 6/1993 | Soiferman | |
| 5,714,888 A * | 2/1998 | Naujoks | 324/754.31 |
| 6,095,680 A | 8/2000 | Baratta | |
| 6,201,398 B1 | 3/2001 | Takada | |
| 6,661,243 B2 | 12/2003 | Tamaki et al. | |
| 6,759,850 B2 | 7/2004 | Harzanu et al. | |
| 6,759,862 B2 * | 7/2004 | Kou | 324/527 |
| 6,786,639 B2 | 9/2004 | Covi et al. | |
| 6,971,791 B2 | 12/2005 | Borden et al. | |
| 6,984,064 B1 | 1/2006 | Touzelbaev | |
| 7,109,730 B2 | 9/2006 | Slupsky | |
| 7,167,806 B2 | 1/2007 | Hamann et al. | |
| 7,250,785 B2 | 7/2007 | Kawaike et al. | |
| 7,355,417 B1 * | 4/2008 | Shusterman et al. | 324/754.21 |
| 7,444,260 B2 | 10/2008 | Raad | |
| 7,554,352 B2 | 6/2009 | Huie | |
| 7,690,838 B2 | 4/2010 | Sumi | |
| 2005/0184736 A1 * | 8/2005 | Ramesh et al. | 324/522 |
| 2007/0102504 A1 | 5/2007 | Cohen | |
| 2008/0076536 A1 | 3/2008 | Shayesteh | |
| 2008/0082288 A1 | 4/2008 | Raad | |
| 2008/0111561 A1 | 5/2008 | Kormanyos | |

(Continued)

OTHER PUBLICATIONS

Evans-Pughe, C., Heat Signature [data security], Journal: Electronics Systems and Software, Feb.-Mar. 2006, pp. 10-14, IEE, United Kingdom.

(Continued)

*Primary Examiner* — Paresh Patel
(74) *Attorney, Agent, or Firm* — Hamilton & Terrile, LLP; Robert W. Holland

(57) ABSTRACT

Counterfeit electronic devices are detected by comparing a thermal profile of the counterfeit device and an authentic device under predetermined operating conditions. A thermal profile for an authentic electronic device is recorded executing an instruction set over time, such as with static infrared images at predetermined times, video infrared images over a predetermined time period or temperature measurements made at predetermined locations of the electronic device. In one embodiment, a thermal profile indicates that a processor device has been used in the place of a field programmable grid array device. In an alternative embodiment, an electromagnetic profile is detected instead of or in addition to the thermal profile. The electromagnetic profile of an authentic device is used to create an expected profile for comparison with an electromagnetic profile of electronic devices under test.

19 Claims, 4 Drawing Sheets

U.S. PATENT DOCUMENTS

| | | |
|---|---|---|
| 2008/0265176 A1 | 10/2008 | Chauhan et al. |
| 2009/0099830 A1 | 4/2009 | Gross et al. |
| 2009/0102487 A1 | 4/2009 | Cases et al. |
| 2009/0245322 A1 | 10/2009 | Hudgings et al. |
| 2010/0163730 A1 | 7/2010 | Schmidt et al. |
| 2010/0213890 A1 | 8/2010 | Winger et al. |
| 2010/0250457 A1 | 9/2010 | Seitz et al. |
| 2011/0122916 A1 | 5/2011 | Simpson |
| 2011/0200067 A1 | 8/2011 | Sinbar et al. |

OTHER PUBLICATIONS

"Detective Work finds board failures", Thomas Paquette, Insight Analytics Labs, Aug. 2006, pp. 39-42.

"Defending Against Counterfeit Electronic Parts and Gray Market Practices", Rochester Electronics, Jan. 2007, pp. 1-10.

* cited by examiner

ELECTROMAGNETIC PROFILING TO VALIDATE ELECTRONIC DEVICE AUTHENTICITY

BACKGROUND OF THE INVENTION

1. Field of the Invention

The present invention relates to validation of device authenticity and more particularly to electromagnetic profiling to validate electronic device authenticity.

The present application relates to application Ser. No. 12/404,851, entitled "Thermal Profiling to Validate Electronic Device Authenticity" by David B. Kumhyr, Yvonne M. Young and Glenn D. Johnson, filed concurrently with the present application.

2. Description of the Related Art

Much of the value found in electronic devices is developed during the design of the electronic devices rather than the manufacture of the electronic devices. For example, an integrated circuit processor often results from an intense and expensive development process, but the actual materials used to build the integrated circuit processor typically cost only a few dollars. To protect the investment made in development, integrated circuit manufacturers attempt to keep integrated circuit designs from becoming public so that counterfeiters cannot copy the designs and produce fake circuits. In some instances, however, counterfeiters reverse engineer the design or the functions performed by the design to create counterfeit devices. For example, switch and router electronic devices are built with many different kinds of electronic devices, such as integrated circuit processors, application specific integrated circuits (ASICs) and field programmable grid arrays (FPGAs). FPGAs are basically a collection of logical ports and functions, which can be combined in an arbitrary fashion to perform a specific function. A counterfeiter might assemble a router or switch device with a combination of authentic electronic devices that are difficult to counterfeit, such as processor components, and counterfeit devices that are somewhat easier to reverse engineer, such as FPGA components. A counterfeiter might also alter an existing electronic device by removing selected components and replacing the selected components with counterfeit components that include insidious functions. For example, FPGA functions are mimicked based on inputs and outputs by instead programming the functions into a sufficiently powerful but less expensive processor or microcontroller that includes additional functionality. A counterfeiter hides the misdeed by simply labeling the counterfeit microcontroller with the counterfeited FPGA identifier. An end user who purchases a device with counterfeit electronic device components often has no idea unless something goes wrong.

The presence of counterfeit electronic devices or electronic device components within an electronic device presents a number of business risks and security risks. With respect to business risks, an enterprise that purchases a device from a name brand manufacturer typically pays more for the device relative to competitive devices under the assumption that the name brand device has a higher quality with better performance and reliability. Manufacturers who have their products counterfeited risk a loss in reputation because of failures associated with counterfeit components. Components that do not function up to the original manufacture specifications expose the end user to unplanned outages and denial of warranty service, while the manufacturer is exposed to potential liability for fixing systems that the manufacturer did not build or sell. For example, the manufacturer may not recognize the counterfeit components or may elect to provide warranty service to protect its reputation. In addition, counterfeit electronic devices and altered electronic devices that include counterfeit components often have different electromagnetic interference (EMI) characteristics from an authentic unaltered electronic device. Counterfeit electronic devices and components can introduce EMI that exceeds Federal Communication Commission (FCC) limits and that interferes with the operation of other electronic components. Security risks arise where counterfeit equipment is altered to allow unauthorized access to the device or other malicious effects. A microcontroller that mimics FPGA functionality in a router or switch might include additional functionality that allows communication of information to unauthorized network addresses.

SUMMARY OF THE INVENTION

In accordance with the present invention, an electronic device runs with a predetermined set of operating conditions. In one embodiment, a thermal profile of the electronic device is compared with an expected thermal profile to determine if the device or components within the device are authentic or counterfeit. In an alternative embodiment, an electromagnetic profile of the electronic device is compared with an expected electromagnetic profile to determine if the device or components within the device are authentic or counterfeit. Thermal profile and electromagnetic profile testing may both be used to test a given electronic device to increase the likelihood that counterfeit components or other alterations made to the electronic device will be discovered.

This invention describes a method and apparatus for determining the authenticity of an electronic device based upon a thermal profile of the electronic device. A thermal profile of an authentic device is determined by executing an instruction set on the electronic device under predetermined operating conditions, and measuring the thermal profile with thermal detection devices, such as an infrared camera that views the electronic device or thermometers placed at predetermined positions that measure temperatures associated with the electronic device. An electronic device under test is subjected to the same operating conditions so that a comparable thermal profile is determined using a thermal detection device. For example, temperatures for components within the electronic device are measured using infrared or thermometer devices. If the thermal profile of the electronic device under test falls within a predetermined range of the authentic electronic device thermal profile, the device is deemed authentic; if not, the device is deemed a counterfeit.

This invention further describes a method and apparatus for determining the authenticity of an electronic device based upon an electromagnetic profile of the electronic device. An electromagnetic profile of an authentic device is determined by executing an instruction set on the electronic device under predetermined operating conditions, and measuring the electromagnetic profile with electromagnetic detection devices, such as an antenna that receives radiofrequency energy emitted from the electronic device or at predetermined positions within the electronic device. An electronic device under test is subjected to the same operating conditions so that a comparable electromagnetic profile is determined using a electromagnetic detection device. For example, electromagnetic frequency and amplitude information for the electronic device or components within the electronic device are measured using antennae. If the electromagnetic profile of the electronic device under test falls within a predetermined range of the authentic electronic device electromagnetic profile, the device is deemed authentic; if not, the device is deemed a counterfeit

BRIEF DESCRIPTION OF THE DRAWINGS

The present invention may be better understood, and its numerous objects, features, and advantages made apparent to those skilled in the art by referencing the accompanying drawings. The use of the same reference number throughout the several figures designates a like or similar element.

DETAILED DESCRIPTION

Figure 1:
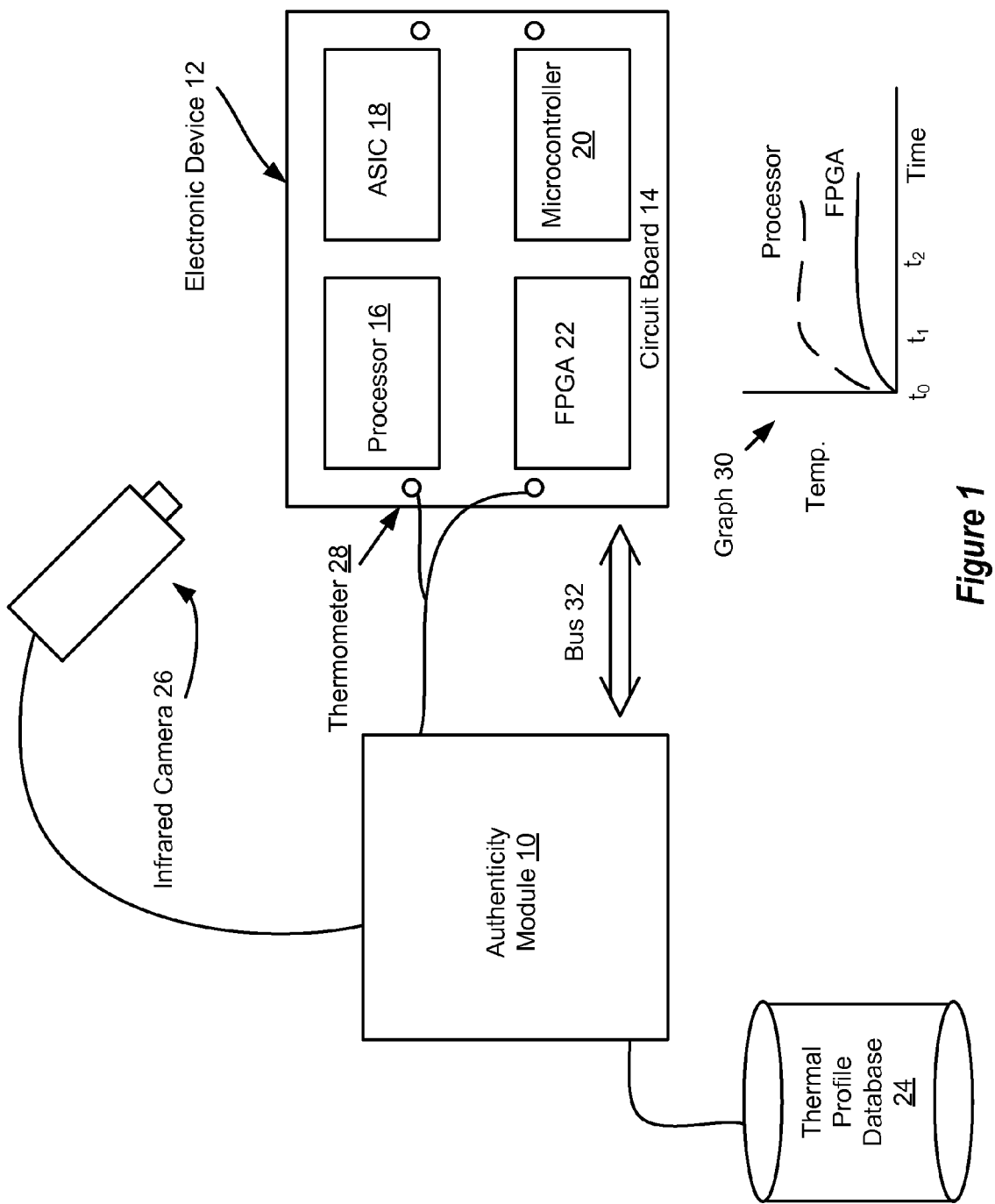
FIG. 1 shows an authenticity module in which selected embodiments of the present invention may be implemented.

Referring now to FIG. 1, a block diagram depicts an authenticity module 10 which analyzes a thermal profile of an electronic device 12 to determine if the electronic device is authentic or counterfeit. Authenticity module 10 is, for example, instructions running on a processor and a computer readable medium, such as a personal computer. Electronic device 12 is any type of electronic device built from one or more electronic components. For example, electronic device 12 is a router, a switch or a personal computer built on a circuit board 14 with a processor 16, an application specific integrated circuit (ASIC) 18, a microcontroller 20 and a field programmable grid array (FPGA) 22. As electronic power is run through the components, such as with power connections formed in circuit board 14, the electronic device components perform operations that produce heat as a byproduct. Generally, processor 16, ASIC 18 and microcontroller 20 are capable of performing the functions of FPGA 22 but with a greater use of power and greater production of heat as a byproduct. An authentic electronic device is one which was manufactured by an authorized manufacturer to specifications set for the electronic device, such as a set of authorized components. A counterfeit electronic device is one which was not manufactured by an authorized manufacturer or that was manufactured by an authorized manufacturer but subsequently altered, such as by the replacement of authorized components with unauthorized components.

Authenticity module 10 analyzes a thermal profile of an electronic device to determine if the device is authentic or counterfeit. Authenticity module 10 performs an authenticity analysis by comparing a thermal profile detected at an electronic device 12 operating under predetermined conditions with thermal profiles of authentic electronic devices stored in a thermal profile database 24. Authentic electronic device thermal profiles are generated by monitoring thermal energy associated with components during operation of the components in a set environmental condition, such as a constant preset external temperature and power supply. For example, a selected instruction set is executed on electronic device 12 over a period of time, during which the components in electronic device 12 are monitored by thermal detection devices, such as an infrared camera 26, a strip of aligned crystal thermometers 28 in set positions relative to the components, or other temperature measuring devices, such temperature sensitive color strips that change colors at different temperatures. The thermal profile includes static infrared images taken at time setpoints for electronic device 12 and/or components within electronic device 12, an infrared video image taken over a time period or temperature measurements at set locations. The thermal profile includes information about the temperatures of the components relative to each other. Authenticity module 10 uses the thermal profile information about known authentic electronic devices 12 as stored in thermal profile database 24 to compare with measured thermal profiles of suspect electronic devices 12 in order to determine if the suspect electronic device is authentic or counterfeit.

In operation, authenticity module 10 interfaces with thermal profile detection devices, such as infrared camera 26 or thermometer 28, and with thermal profile database 24. Authenticity module 10 communicates an instruction set through a bus 32 for execution on electronic device 20, such as the instruction set used on an authentic electronic device to create thermal profile database 24. Authenticity module 10 commands execution of the instruction set and commands gathering of thermal profile information from thermal profile detector devices, such as infrared information from infrared camera 26 and temperature information from thermometer 28. Graph 30 depicts an example of temperatures measured over time for a processor 16 and an FPGA 22. Authenticity module 10 compares the measured thermal profile information with thermal profile information in thermal profile database 24 to determine if electronic device 12 is authentic or counterfeit. The comparison can include infrared information at static time set points, such as $t_1$ and $t_2$, over a time period, such as the time between $t_1$ and $t_2$, or temperature information gathered by a thermometer 28. The comparison may be automatic based on measured temperature values that fall within a desired range or the temperature values of the thermal profile database 24 values, or may be presented at a display for consideration by an end user. Comparisons might also include temperature differences measured between components of an electronic device 12 and the differences between the same devices in thermal profile database 24. As an example, if a counterfeit electronic device 12 replaced an FPGA 22 with a microcontroller 20 or other type of processor, the processor will run at a higher temperature than the FPGA in the authentic thermal profile and will also run nearer in temperature to the other processors on the electronic device 12. Comparisons might also include a comparison with a known counterfeit device thermal profile so that match with that thermal profile by a device under test establishes the device under test as a counterfeit.

Figure 2:
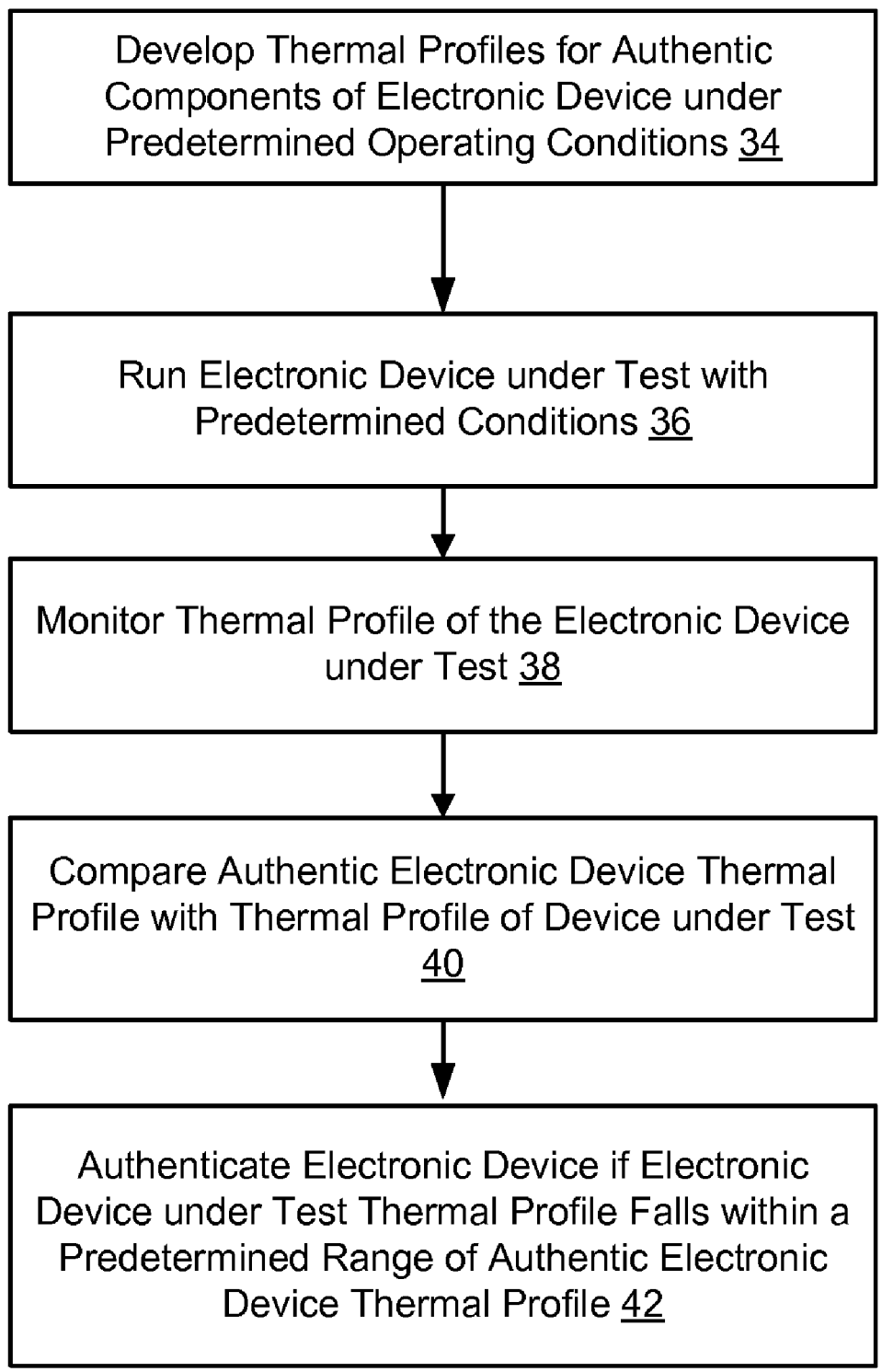
FIG. 2 shows a flow diagram of a process for identifying electronic device components as authentic or counterfeit in which selected embodiments of the present invention may be implemented.

Referring now to FIG. 2, a flow diagram depicts a process for identifying electronic devices as authentic or counterfeit. The process begins at step 34 with the development of thermal profiles for authentic components in an authentic electronic device running under predetermined conditions. For example, a given instruction set is looped in execution on the authentic device for set time period with set environmental conditions and thermal measurements are taken by thermal detection devices, such as an infrared camera or thermometers. At step 36, an electronic device under test for authenticity is placed under the predetermined conditions used to generate the authentic thermal profile, such as by executing the same instruction set at the same environmental conditions for the same time period. At step 38, the thermal profile of the electronic device under test is monitored during the predetermined conditions. For example, infrared static or video images of the electronic device and its components or temperature readings from set thermometer positions are taken over the test time period. At step 40, the authentic electronic device thermal profile is compared against the thermal profile measured at the electronic device under test to determine if the measured thermal profile falls within a predetermined range of the authentic thermal profile. At step 42, if the measured thermal profile falls within a predetermined range of the authentic thermal profile, the electronic device under test is deemed authentic. If the measured thermal profile falls outside of the predetermined range of the authentic thermal profile, the electronic device under test is deemed a counterfeit.

Figure 3:
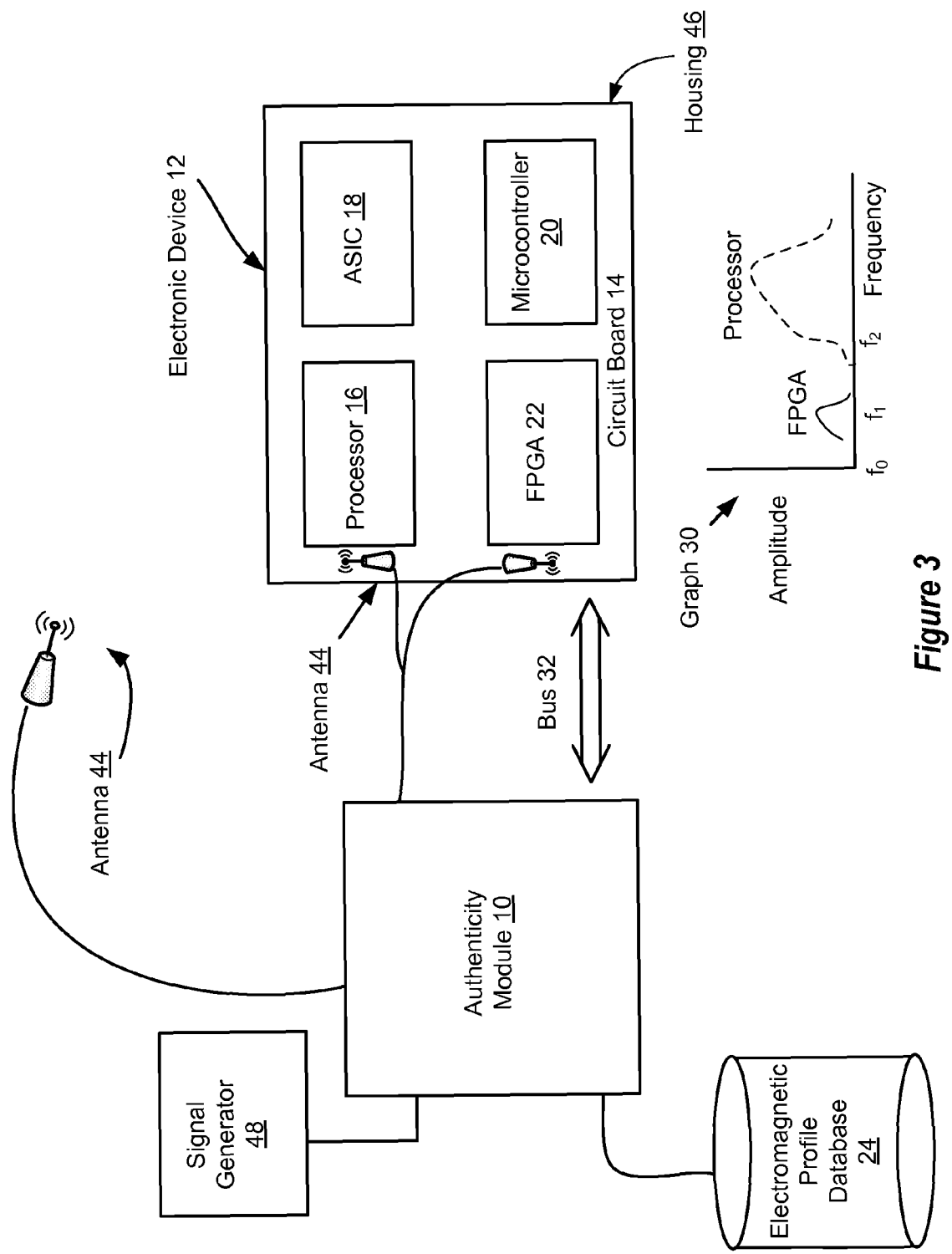
FIG. 3 shows an authenticity module in which selected embodiments of the present invention may be implemented.
Figure 4:
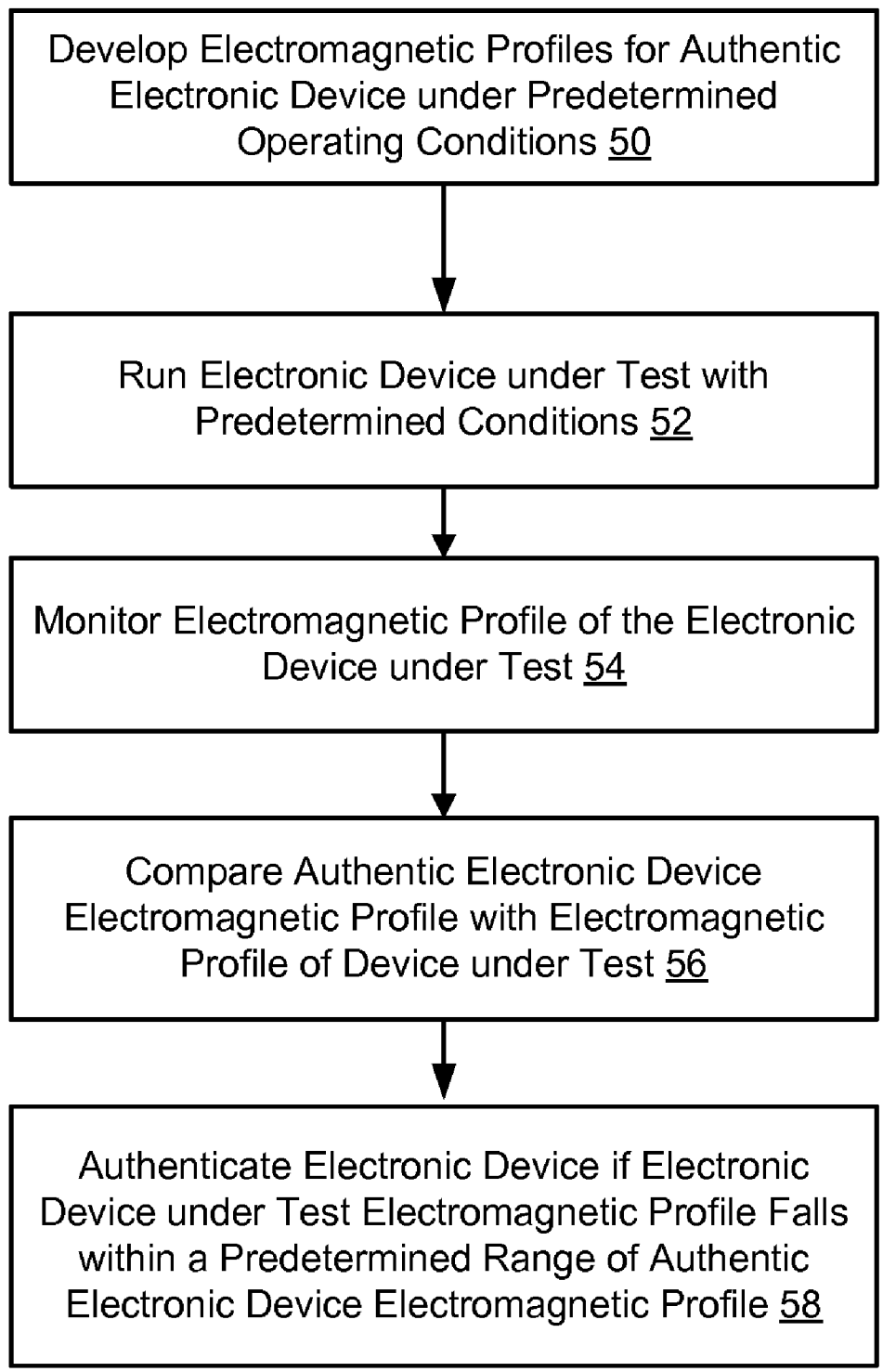
FIG. 4 shows a flow diagram of a process for identifying an electronic device as authentic or counterfeit in which selected embodiments of the present invention may be implemented

Referring now to FIG. 3, a block diagram depicts an authenticity module 10 which analyzes an electromagnetic profile of an electronic device 12 to determine if the electronic device is authentic or counterfeit. Authenticity module 10 is, for example, instructions running on a processor and a computer readable medium, such as a personal computer. As electronic power is run through the components, such as with power connections formed in circuit board 14, the electronic device components perform operations that produce radiofrequency electromagnetic energy as a byproduct. Generally, processor 16, ASIC 18 and microcontroller 20 are capable of performing the functions of FPGA 22 but with a greater a greater number of instructions and at greater operating frequencies so that electromagnetic radiation as a byproduct processor-type devices will have a higher frequency and higher amplitude than that of FPGA devices.

Authenticity module 10 analyzes an electromagnetic profile of an electronic device to determine if the device is authentic or counterfeit. Authenticity module 10 performs an authenticity analysis by comparing an electromagnetic profile detected at an electronic device 12 operating under predetermined conditions with electromagnetic profiles of authentic electronic devices stored in an electromagnetic profile database 24. Authentic electronic device electromagnetic profiles are generated by monitoring electromagnetic energy associated with operation of electronic device 12 in a predetermined operating condition. For example, a selected instruction set is executed on electronic device 12 during which electronic device 12 and/or the components in electronic device 12 are monitored by antennas 44 interfaced with a spectrograph of authenticity module 10. In one embodiment, antennae 44 are located external to a housing 46 that contains the electronic components so that the electromagnetic profile includes radiofrequency collectively output from the components within housing 46. In an alternative embodiment, antennae are located in set positions within housing 46 relative to the components to measure radiofrequency energy output in close proximity to selected components. The electromagnetic profile includes radiofrequency energy frequency and amplitude output when electronic device 12 executes instructions. A particular instruction set may be designed to execute on particular components for more accurate analysis of electromagnetic energy output from a component. Alternatively, a signal generator 48 introduces a predetermined electromagnetic signal to electronic device 12 through a port interfaced with bus 32 so that electromagnetic energy that passes from within housing 46 is measured at antenna 44 external to housing 46. The electromagnetic profile includes information about the frequency and amplitude of the components within housing 46 relative to each other. Authenticity module 10 uses the electromagnetic profile information about known authentic electronic devices 12 as stored in electromagnetic profile database 24 to compare with measured electromagnetic profiles of suspect electronic devices 12 in order to determine if the suspect electronic device is authentic or counterfeit.

In operation, authenticity module 10 interfaces with antennae 44, with electromagnetic profile database 24, and with signal generator 48. Authenticity module 10 communicates an instruction set through a bus 32 for execution on electronic device 20, such as the instruction set used on an authentic electronic device to create electromagnetic profile database 24. Authenticity module 10 commands execution of the instruction set and commands gathering of electromagnetic profile information from antennae 44. Graph 30 depicts an example of frequency and amplitude information for electromagnetic energy measured for a processor 16 and an FPGA 22. Authenticity module 10 compares the measured electromagnetic profile information with electromagnetic profile information in electromagnetic profile database 24 to determine if electronic device 12 is authentic or counterfeit. The comparison can include the frequency of electromagnetic energy, the amplitude of electromagnetic energy or other types of relationships. The comparison may be automatic based on measured electromagnetic energy values that fall within a desired range of the electromagnetic energy values of the electromagnetic profile database 24 values, or may be presented at a display for consideration by an end user. Comparisons might also include electromagnetic energy differences measured between components of an electronic device 12 and the differences between the same devices in electromagnetic profile database 24. As an example, if a counterfeit electronic device 12 replaced an FPGA 22 with a microcontroller 20 or other type of processor, the processor will run at a higher frequency and amplitude levels of electromagnetic energy than will the FPGA in the authentic electromagnetic profile and will also run nearer in frequency and amplitude to the other processors on electronic device 12. Comparisons might also include a comparison with a known counterfeit device electromagnetic profile so that a match with that electromagnetic profile by a device under test establishes the device under test as a counterfeit.

Referring now to FIG. 2, a flow diagram depicts a process for identifying electronic devices as authentic or counterfeit. The process begins at step 34 with the development of electromagnetic profiles for authentic components in an authentic electronic device running under predetermined conditions. For example, a given instruction set is looped in execution on the authentic device for set time period with set environmental conditions and electromagnetic energy measurements are taken by antennae 44 and a spectrograph running on authenticity module 10. At step 36, an electronic device under test for authenticity is placed under the predetermined conditions used to generate the authentic electromagnetic profile, such as by executing the same instruction set at the same environmental conditions for the same time period. At step 38, the electromagnetic profile of the electronic device under test is monitored during the predetermined conditions. At step 40, the authentic electronic device electromagnetic profile is compared against the electromagnetic profile measured at the electronic device under test to determine if the measured electromagnetic profile falls within a predetermined range of the authentic electromagnetic profile. At step 42, if the measured electromagnetic profile falls within a predetermined range of the authentic electromagnetic profile, the electronic device under test is deemed authentic. If the measured electromagnetic profile falls outside of the predetermined range of the authentic electromagnetic profile, the electronic device under test is deemed a counterfeit.

Consequently, the invention is intended to be limited only by the spirit and scope of the appended claims, giving full cognizance to equivalents in all respects.

What is claimed is:

1. A method for determining whether an electronic device is authentic or counterfeit, the method comprising:
   running the electronic device under predetermined operating conditions, the predetermined conditions comprising at least an instruction set executing on the electronic device;
   monitoring an electromagnetic profile of the electronic device;
   comparing the electromagnetic profile with an expected electromagnetic profile;
   determining the electronic device as authentic if the electromagnetic profile has the expected electromagnetic profile; and
   determining the electronic device as counterfeit if the electromagnetic profile lacks the expected electromagnetic profile.

2. The method of claim 1 further comprising:
   running an authentic electronic device under the predetermined operating conditions; and
   monitoring an electromagnetic profile of the authentic electronic device to generate the expected electromagnetic profile.

3. The method of claim 2 wherein the expected electromagnetic profile comprises a range of radio frequencies associated with the electronic device.

4. The method of claim 2 wherein the authentic electronic device comprises an FPGA and the counterfeit electronic device replaces the FPGA with a processor.

5. The method of claim 4 wherein the electromagnetic profile comprises radio frequency amplitudes at predetermined radio frequencies.

6. The method of claim 4 wherein the electromagnetic profile comprises radio frequency energy at predetermined positions external to a housing of the electronic device.

7. The method of claim 4 wherein the electromagnetic profile comprises radio frequency energy at predetermined positions within a housing of the electronic device.

8. The method of claim 1 wherein the electronic device comprises plural electronic components and wherein comparing further comprises comparing an electromagnetic profile for each of the plural components with an expected electromagnetic profile for each of the plural components.

9. The method of claim 8 wherein the electronic device comprises a router and the plural components comprise one or more field programmable arrays.

10. A system for identifying electronic devices as authentic or counterfeit, the system comprising:
    an electromagnetic profile database having expected electromagnetic profiles for one or more electronic devices under one or more predetermined operating conditions, the predetermined operating conditions including at least an instruction set executing on the one or more electronic devices;
    an electromagnetic profile detector operable to detect an electromagnetic profile of an electronic device under test; and
    an authenticity module interfaced with the electromagnetic profile database and the electromagnetic profile detector, the authenticity module operable to compare an electromagnetic profile of the electronic device under test with an expected electromagnetic profile to identify the electronic device as authentic or counterfeit.

11. The system of claim 10 wherein the electromagnetic profile detector comprises an antenna disposed in a housing of the electronic device and operable to detect radiofrequency energy of the electronic device.

12. The system of claim 10 wherein the electromagnetic profile detector comprises an antenna disposed outside of a housing of the electronic device and operable to detect radiofrequency energy of the electronic device.

13. The system of claim 10 wherein the electromagnetic profile detector comprises:
    a signal source interfaced with the electronic device and operable to communicate radiofrequency energy into a port at a housing of the electronic device; and
    an antenna disposed outside of the housing of the electronic device and operable to detect radiofrequency input by the signal source.

14. The system of claim 10 wherein the electronic device comprises plural electronic components, the electromagnetic profile database comprises an electromagnetic profile for each electronic component under the predetermined operating conditions.

15. The system of claim 14 wherein the electromagnetic profile comprises the relative radiofrequency of the plural electronic components.

16. The system of claim 14 wherein the authentic electronic device includes at least a field programmable gate array component and the counterfeit electronic device comprises a processor used in the place of the field programmable gate array.

17. A method for identifying one or more components of an electronic device, the method comprising:
    executing an instruction set on the electronic device;
    measuring an electromagnetic profile for the one or more components while the instruction set is executing on the electronic device;
    comparing the measured electromagnetic profile for the one or more components with expected electromagnetic profiles; and
    identifying the one or more components based upon the comparing.

18. The method of claim 17 wherein comparing the measured electromagnetic profile comprises comparing a component electromagnetic profile with an expected electromagnetic profile of a counterfeit component to identify the component as a counterfeit component.

19. The method of claim 17 wherein the expected electromagnetic profile comprises an electromagnetic profile of a field programmable gate array executing the instructions and the measured electromagnetic profile comprise an electromagnetic profile of a processor mimicking a field programmable gate array, and wherein identifying the one or more components further comprises identifying the one or more components as a counterfeit.

* * * * *